(12) United States Patent
Chang et al.

(10) Patent No.: US 8,864,190 B2
(45) Date of Patent: Oct. 21, 2014

(54) STRUCTURE OF SLIDE RAIL LATCH FOR CABINET

(75) Inventors: Fu-Tien Chang, New Taipei (TW); Mei-Lan Hsu, New Taipei (TW)

(73) Assignee: Nan Juen International Co., Ltd., New Taipei (TW)

( * ) Notice: Subject to any disclaimer, the term of this patent is extended or adjusted under 35 U.S.C. 154(b) by 597 days.

(21) Appl. No.: 13/111,432

(22) Filed: May 19, 2011

(65) Prior Publication Data
US 2012/0292928 A1  Nov. 22, 2012

(51) Int. Cl.
*E05C 17/04*  (2006.01)
(52) U.S. Cl.
USPC ............. 292/273; 292/95; 292/109; 292/116
(58) Field of Classification Search
USPC ................................. 292/273, 95, 109, 116
See application file for complete search history.

(56) References Cited

U.S. PATENT DOCUMENTS

| | | | | |
|---|---|---|---|---|
| 6,773,080 B2 * | 8/2004 | Chen et al. | | 312/265.1 |
| 6,910,306 B2 * | 6/2005 | Waalkes et al. | | 52/239 |
| 7,281,633 B2 * | 10/2007 | Hartman et al. | | 211/26 |
| 7,641,297 B2 * | 1/2010 | Huang | | 312/334.4 |
| 7,744,177 B2 * | 6/2010 | Peng et al. | | 312/334.4 |

* cited by examiner

*Primary Examiner* — Mark Williams
(74) *Attorney, Agent, or Firm* — Muncy, Geissler, Olds & Lowe, P.C.

(57) ABSTRACT

This present invention is an improved structure of slide rail latch for device cabinet, which includes: at least one slide rail fixing frame with a locking plate on its front end, and a locking base plate with upper and bottom locking ends on both sides. The locking base plate is composed of at least one latching hole, one locking pin and one latching fastener, which includes one latching base plate with upper and bottom latch bending side edges on both sides. This latching base plate is composed of at least one locking hook and locking hole which are correspondent with latching hole and locking pin respectively. The latch bending side edge includes a hook on its front end. Thus this invention will make the fixing frame of slide rail can be easily manufactured in all-in-one process, and more convenient and timesaving in assembly to improve economic benefit for assembly manufacturers.

10 Claims, 5 Drawing Sheets

STRUCTURE OF SLIDE RAIL LATCH FOR CABINET

BACKGROUND OF THE INVENTION

1. Field of the Invention

This present invention relates to an improved structure of slide rail latch for cabinet with simple composition, easy-to-assembly and dismantling applications 2. Description of the Related Art Commonly, the structure of general fixed electronic devices (such as industrial computer, etc.), please refer to FIG. 1 and FIG. 1A, is composed of one cabinet (100) with supporting frames (101) which are installed and perpendicular to one another on the front and rear ends of its side. Correspondent and vertical-aligning level holes (102) are installed on the slide rail fixing frame (103). Such level hole (102) is latched with one correspondent slide rail fixing frame (103). One slide rail set (104) is installed on the slide rail fixing frame (103) which is composed of at least bottom rails and inner rails; among which, the bottom rails are latched and fixed on the slide rail fixing frame (103), and the distant side of inner rail from the bottom rail is connected with electronic device (not showed in drawing). Shields (105) are installed on the front and rear ends of slide rail fixing frame (103). Shield (105) is equipped with slide block (106) inside, and a spring (107) is installed on one recessed end of the slide block (106). The other end of this spring (107) is fixed on the inner side of shield (105). In addition, the other end of slide block (106) is equipped with a convex fitting pin (108) for the shield (105). Such fitting pin (108) is extruded by the spring (107) and normally will maintain outward position to fit in the level hole (102). Hook (109) is installed on the part of slide rail fixing frame (103) where close to the fitting pin (108). The hook (109) can be latched in the level hole (102) in order to prevent the fitting pin (108) loosing from the level hole (102). However, the utility of this device and structure is restricted to some defects, including the specifications of electronic devices, waste of materials, difficulties in manufacturing, 2-hands operation, and the frequent hook jam. Therefore, there are many related follow-up technologies that have been developed, including Pat. No. M399583 etc.

Although the aforesaid technology of Patent No. M399583 can be achieved the purpose of assembly and dismantling for devices; however, due to the composition of the slide rail fixing frame is more complicated, it is difficult to manufacture all-in-one model. In addition, its complicated composition will also make its assembly process to become more difficult and time-consuming so as to fail to achieve the economic benefit of manufacturing and assembly; therefore, it needs further improvement.

In consideration of the fact that the slide rail latch structure has some operation defects and it has not yet achieved the most optimal design for its structure, this inventor started to research and develop the solution and hoped to make this present invention of an improved structure of slide rail latch for cabinet with more convenience in manufacturing and assembly and to conform to economic benefits in order to serve the public and advance the development in this industry.

SUMMARY OF THE INVENTION

This present invention is an improved structure of slide rail latch for device cabinet, which is composed of: at least one slide rail fixing frame with a locking plate on its front end. The locking plate is composed of a locking base plate with upper and bottom locking ends on both sides. This locking base plate is composed of at least one latching hole and one locking pin; as well as one latching fastener. This latching fastener includes one latching base plate with upper and bottom latch bending side edges on both sides, and this latching base plate is composed of at least one locking hook and locking hole which are correspondent with latching hole and locking pin respectively. This latch bending side edge includes a hook on its front end. As a result, this improved structure will make the fixing frame of slide rail to be simply and easily manufactured in all-in-one process, as well as more convenient and time-saving in assembly so as to actively upgrade the economic benefit for the assembly manufacturers.

DETAILED DESCRIPTION OF THE PREFERRED EMBODIMENTS

Figure 1:
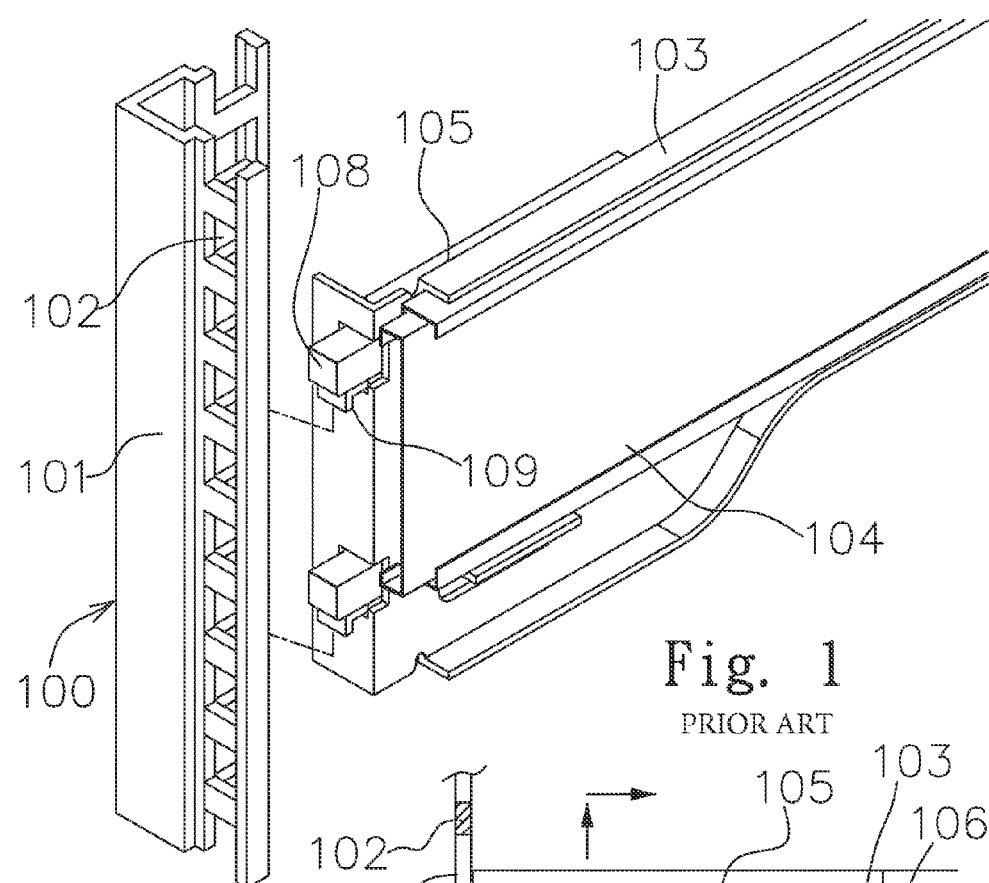
FIG. 1 is a 3D view of this conventional device.
Figure 1A:
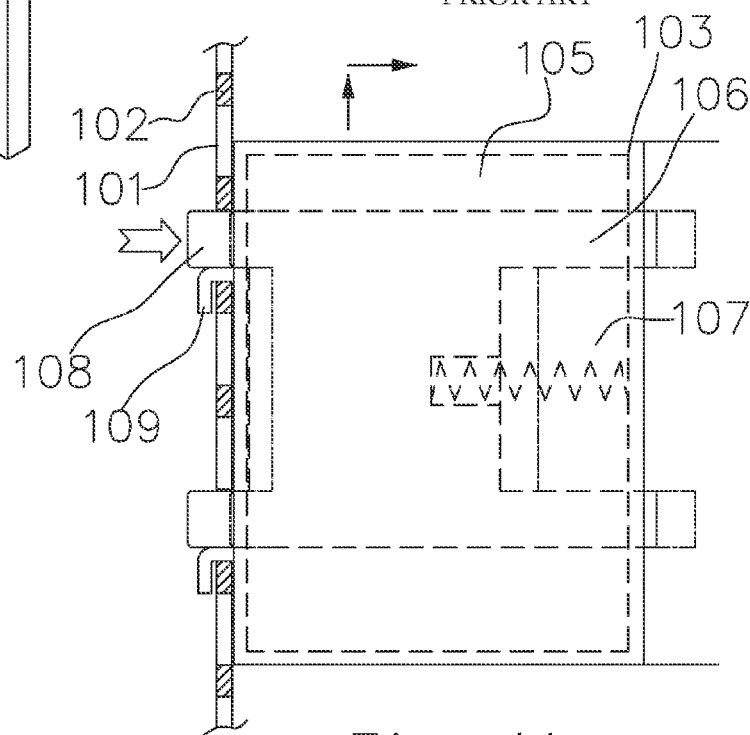
FIG. 1A is a sectional view of this conventional device.
Figure 2:
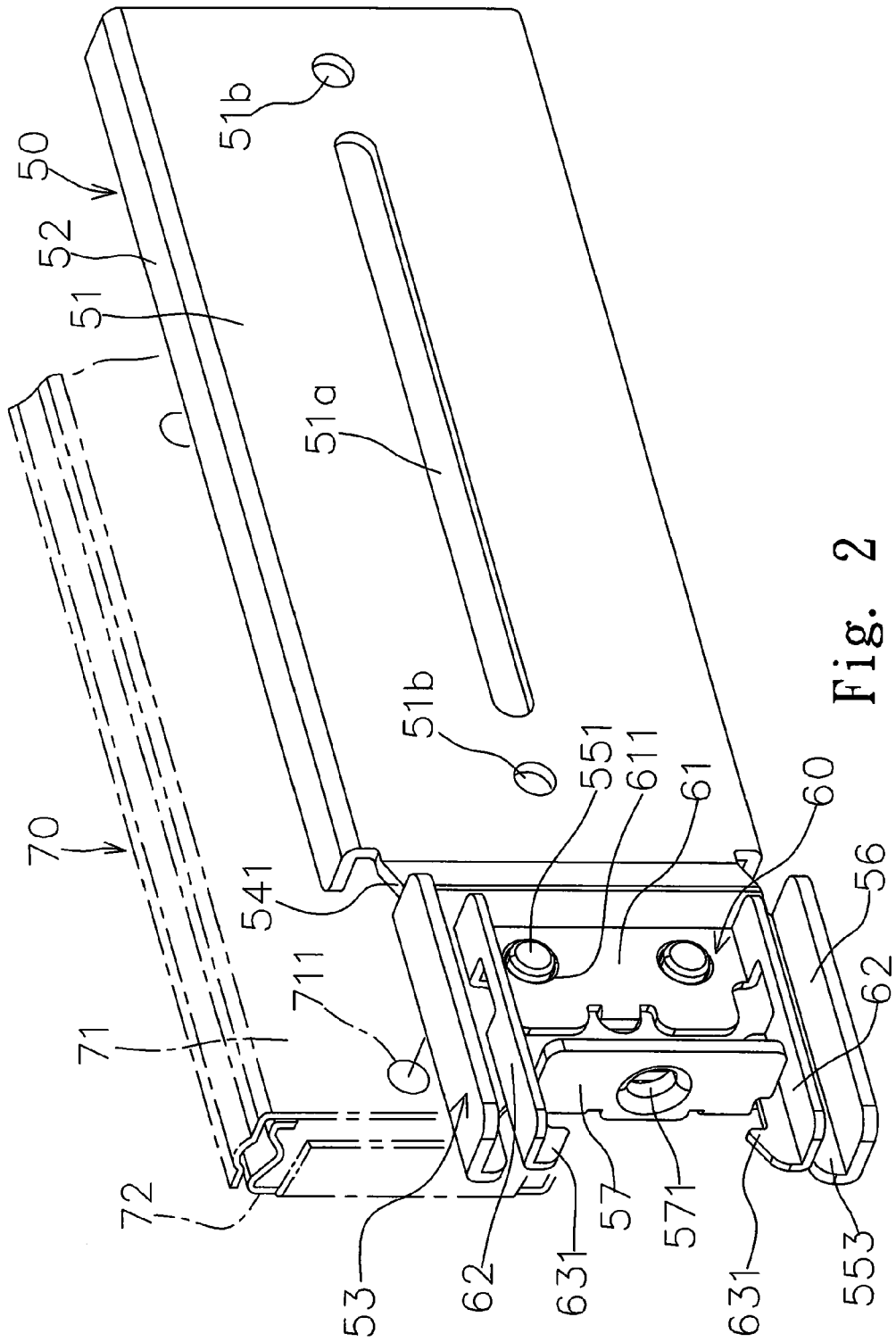
FIG. 2 is a 3D assembly view of this present invention.
Figure 3:
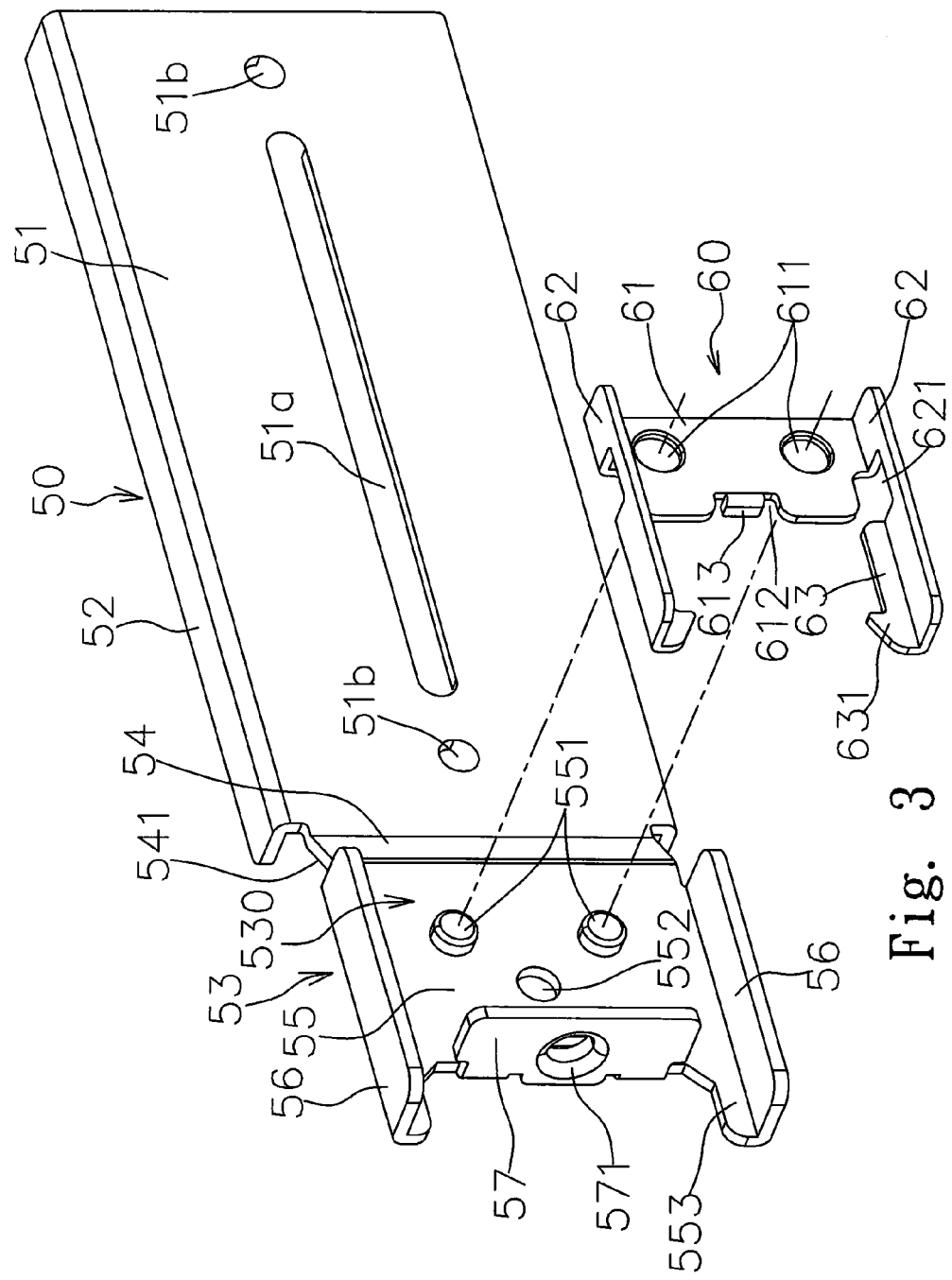
FIG. 3 is a cross-section view of this present invention.

Please refer to FIGS. 2 and 3. This present invention of an improved structure of slide rail latch for cabinet is composed of at least one slide rail fixing frame (50) and latching fastener (60). The slide rail fixing frame (50) is equipped with one base plate (51). The upper and bottom sides of the base plate (51) are equipped with bending sides (52) which bent perpendicularly and toward the same direction (in this present invention, it used a ⊓-shape frame). In addition, a containing space is composed of the same-direction bending side (52) and the inside of base plate (51) (not showed in drawing), which the space can be contained at least one side of the slide rail set (70). The slide rail set (70) is orderly composed of bottom rail (71) and correspondent upper rail (72) (in this present invention, the slide rail set is a dual-rail type, but anyone who is familiar to such technique can replace with actual and exact model types). One end of the bottom rail (71) is equipped with fixing holes (711). The upper rail (72) can be fixed with electronic devices (not showed in drawing). And the base plate (51) is equipped with trench hole (51a) and fixing hole (51b). The slide rail set (70) can be fixed on the base plate (51) by using the fixing hole (711) and (51b). Moreover, one locking plate (53) is installed on the front end of the base plate (51). One slanting plate (54) is connected between the locking plate (53) and the base plate (51), and its side showed as a bevel edge (541). The locking plate (53) is equipped with one locking base plate (55). Locking ends (56) that perpendicularly bent toward the same direction are installed on the locking base plate (55) (in this present invention, it showed as a ⊓-shape frame). One locking space (530) is composed of the locking ends (56) and the inner side of the locking base plate (55); in addition, this locking base plate (55) is equipped with one latching hole (552) and its correspondent locking pin (551). The locking end (56) on the correspondent sides of the front end locking base plate (55) is recessed inwardly and equipped with one blocking plate (57). One thread hole (571) is installed on the blocking plate (57). These 2 inward-recessed sides on the front end of the locking base plate (55) are connected to the locking end (56) with using the connecting plate (553).

The latching fastener (60) includes one latching base plate (61). The upper and bottom sides of the latching base plate (61) are respectively equipped with the latch bending side edges (62) that perpendicularly bent toward the same direction. The latch bending side edges (62) are forwardly stretched from the latching base plate (61). The latching base plate (61) is equipped with pairing locking holes (611), and one recessed part (612) at the central part of the front end. One locking hook (613) is installed on the bending part of this recessed part (612). The latch bending side edge (62) is equipped with one shallow trench (621), and this latch bending side edge (62) is stretched from the shallow trench (621) forwardly to form a hook plate (63) which is perpendicularly bent inward. The front end of this hook plate (63) is quipped with a hook (631); therefore, the shallow trench (621) is used to make better flexibility for this hook plate (63) so as to facilitate the latching and loosing operations of this hook (631).

Figure 4:
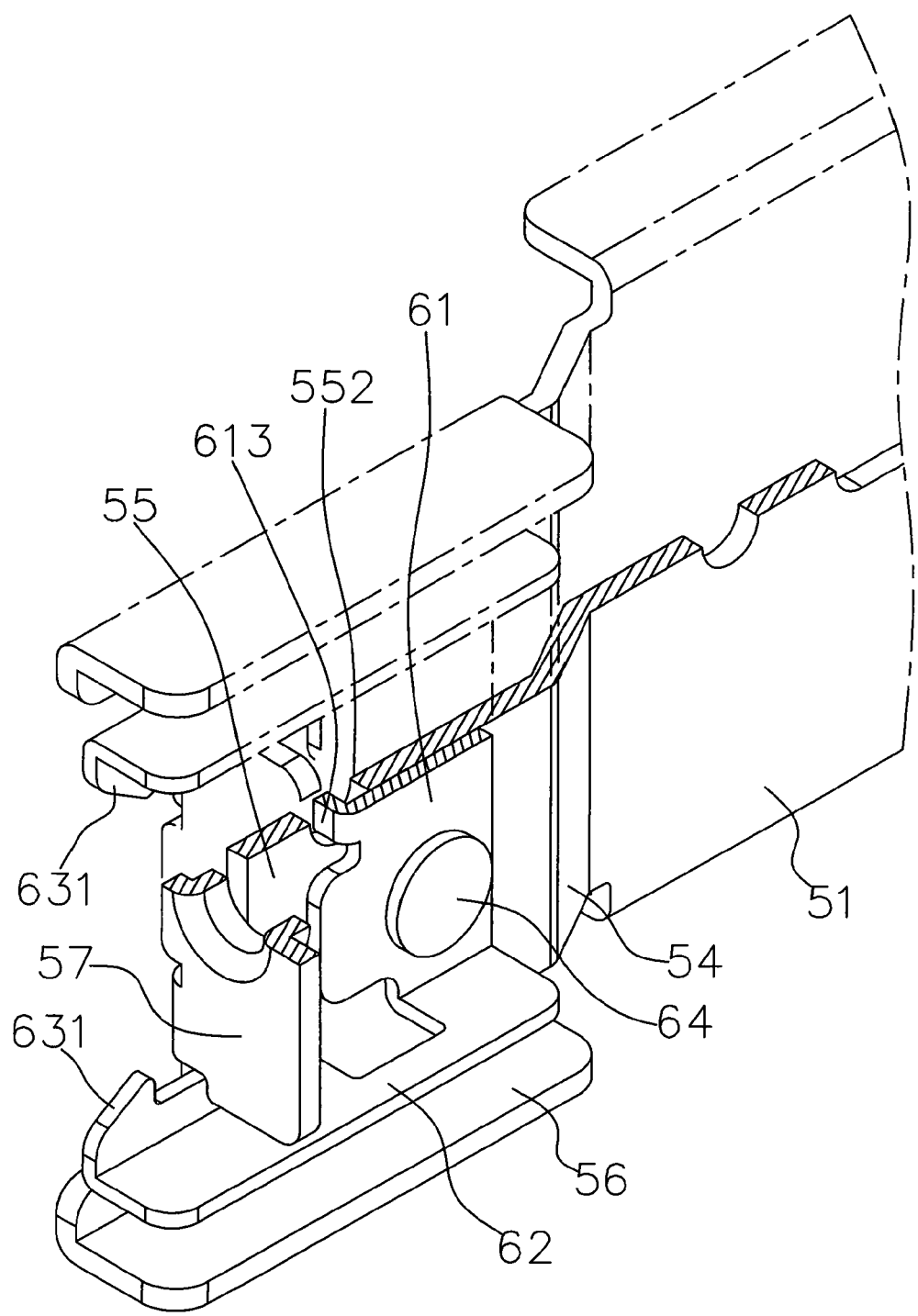
FIG. 4 is a comprehensive cutaway view of this present invention.

Please refer to FIG. 4. When this present invention of an improved structure of slide rail latch for cabinet is combining, the latching fastener (60) has been installed on the locking space (530) of the locking plate (53), and fitted the locking hole (611) on the latching base plate (61) at the fixed position of the locking pin (551) on the locking base plate (55) (in this present invention, this locking pin (551) has been impacted and become a riveting connector. However, the locking pin (551) can be fixed in the locking hole (611) by using a locking fastener (such as screw connector). In addition, the locking hook (613) of the latching base plate (61) is embedded into the latching hole (552) on the locking plate (53) so as to form the assembly locking for the latching fastener (60) and the locking plate (53) (slide rail fixing frame (50)); at this time, the latch bending side edges (62) (the hook plate (63)) on both sides of the latching base plate (61) are in the locking end (56) on both sides of the locking base plate (55).

Figure 5:
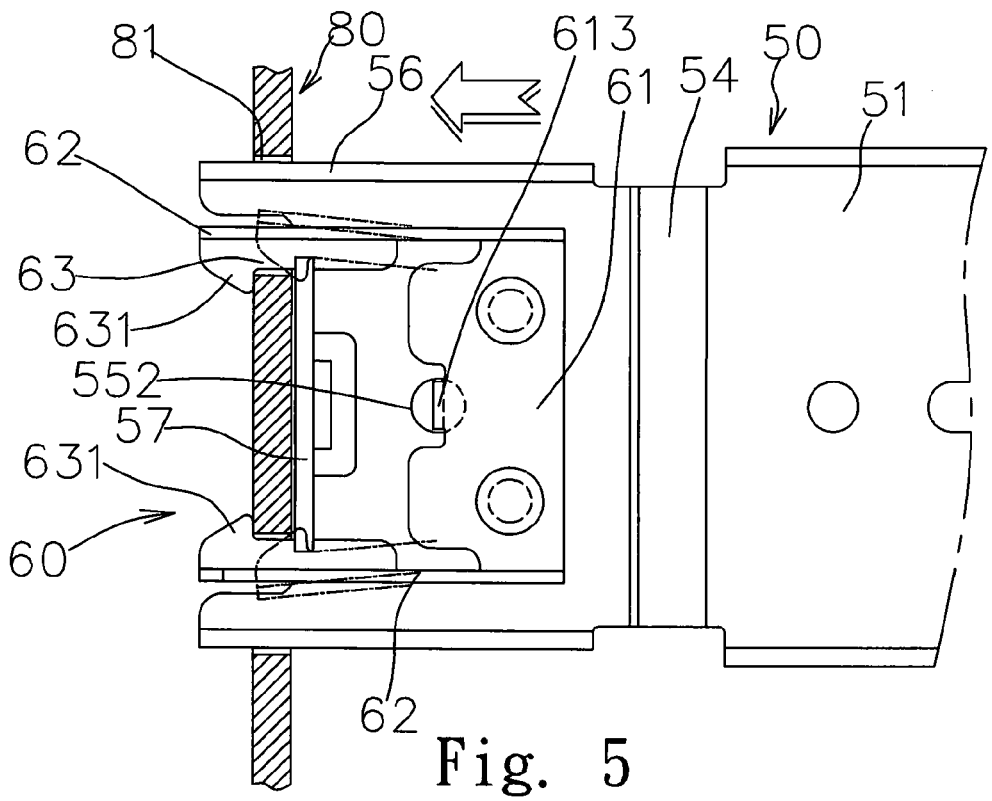
FIG. 5 is a latching operation view of this present invention.

Please refer to FIG. 5. When installing this present invention of an improved structure of slide rail latch for cabinet, firstly fix more than one slide rail fixing frames (50) respectively on the front end or rear end, or both ends of one slide rail set (70), and then fix electronic devices on the slide rail set (70), as well as insert the slide rail fixing frame (50) of the latching fastener (60) into the fitting hole (81) on the cabinet (80) by using its locking plate (53). As a result, the locking end (56) on one side of the locking base plate (55), the latch bending side edge (62) and hook plate (63) on the same side of the latching base plate (61) are inserted into a fitting hole (81), and then using the hook (631) of the latching fastener (60) to lock the fitting hole (81) in order to complete the fixation of the slide rail fixing frame (50) and the cabinet (80) and fix electronic devices on the cabinet (80).

Figure 6:
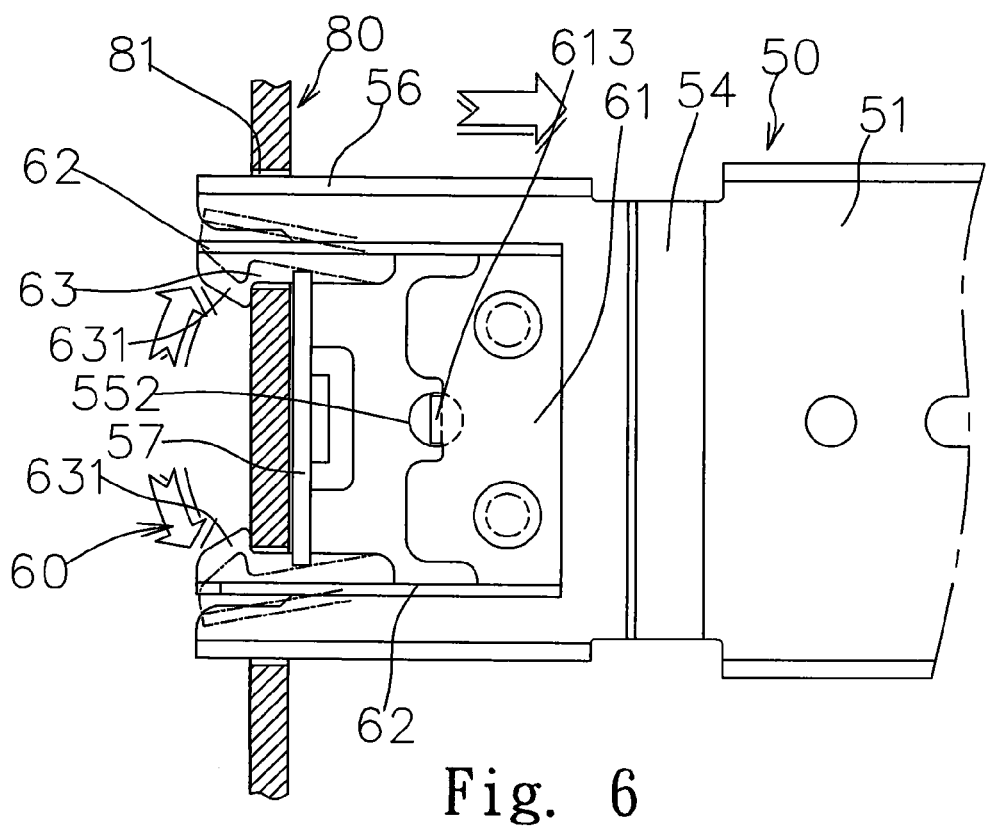
FIG. 6 is a dismantling operation view of this present invention.

Please refer to FIG. 6, When dismantling this present invention of an improved structure of slide rail latch for cabinet, firstly use 2 fingers of the same hand to against both inner sides of the hook (631) of the latch bending side edge (62) which on both sides of the latching fastener (60). Then, use these 2 fingers to press outward respectively. Due to the installation of shallow trench (621) in the latch bending side edge (62), the hook plate (63) has better bending flexibility so as to loose the hook latching from the fitting hole (81). Then, move the slide rail fixing frame (50) inward (backward) to make the locking end (56), the latch bending side edge (62) and the hook plate (63) can be easily loosen from the fitting hole (81) in order to achieve the purpose of convenient assembly and dismantling. Due to the compact design of the slide rail fixing frame for this present invention of an improved structure of slide rail latch for cabinet, it can make this slide rail fixing frame to be easier and convenient for all-in-one design and manufacturing. The combination of the slide rail fixing frame and the latching fastener has also made its assembly become very convenient and timesaving, as well as the optimal economic benefits of assembly and manufacturing.

In conclusion, this present invention certainly conforms to the regulations of new patents; therefore, this inventor is submitted this patent application in accordance with the Patent Law. However, the aforesaid description is only the optimal measures of this present invention but restricts to the filed of this present invention; therefore, equal changes and revisions of every shape, structure, characteristic and spirit in this present invention should be included into the claims of this present invention.

What is claimed is:

1. An improved structure of slide rail latch for a cabinet, the structure comprising:

at least a slide rail fixing frame, a locking plate installed on a front end of said slide rail fixing frame, said locking plate has a locking base plate and two locking ends on an upper side and a bottom side of said locking plate, at least a latching hole and a locking pin mounted on said locking base plate, said locking ends formed with said upper side and said bottom side of said locking base plate bent toward the same direction;

a latching fastener mounted on said locking base plate, said latching fastener comprising a latching base plate and two latch bending side edges on an upper side and a bottom side of said latching base plate, said latch bending side edges extending forwardly from the latching base plate, a recessed part is formed on said central part of the front end of the latching base plate, a locking hook is formed on said recessed part; a locking hole is formed on said latching base plate at a fixed position of said locking pin on said locking base plate; said locking hook of said latching base plate embedded into a latching hole on said locking plate; said locking hook and said locking hole formed on said latching base plate respectively correspondent with said latching hole and said locking pin; a latch bending side edge formed with an upper side and a bottom side of the latching base plate respectively and perpendicularly extending toward the same direction, each latch bending side edge in the front end has a hook, each latch bending side edge has a shallow trench, and a hook plate formed by perpendicularly and forwardly bending said latch bending side edge from the shallow trench, therefore, said shallow trench is used to make better flexibility for said hook plate.

2. An improved structure of slide rail latch for a cabinet according to claim 1, wherein said slide rail fixing frame is comprised of a base plate and a bending side formed by bending on an upper side and a bottom side of the base plate respectively and perpendicularly extending toward the same direction; an accommodating space is formed among said bending sides and an inner part of said base plate.

3. An improved structure of slide rail latch for a cabinet according to claim 2, wherein said base plate and said locking plate is connected by a slanting plate.

4. An improved structure of slide rail latch for a cabinet according to claim 1, wherein said locking end and an inner part of said locking base plate form a locking space for installing said latching fastener.

5. An improved structure of slide rail latch for a cabinet according to claim 1, wherein said locking ends and the front sides of said locking base plate is a recessed area.

6. An improved structure of slide rail latch for a cabinet according to claim 5, wherein said recessed area at the front sides of said locking base plate has a blocking plate.

7. An improved structure of slide rail latch for a cabinet according to claim 6, wherein said blocking plate has a thread hole.

8. An improved structure of slide rail latch for a cabinet according to claim 6, wherein said locking end is connected to a side of said recessed area of said front end of said locking base plate by using a connecting plate respectively.

9. An improved structure of slide rail latch for a cabinet according to claim 1, wherein said locking pin is further fixed in said locking hole by using a locking fastener.

10. An improved structure of slide rail latch for a cabinet according to claim 9, wherein said locking fastener is a riveting connector or a screw connector.

* * * * *